(12) United States Patent
Wloczysiak

(10) Patent No.: US 9,893,794 B2
(45) Date of Patent: Feb. 13, 2018

(54) SWITCHING NETWORK FOR DIVERSITY RECEIVERS

(71) Applicant: SKYWORKS SOLUTIONS, INC., Woburn, MA (US)

(72) Inventor: Stephane Richard Marie Wloczysiak, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/339,856

(22) Filed: Oct. 31, 2016

(65) Prior Publication Data

US 2017/0047981 A1  Feb. 16, 2017

Related U.S. Application Data

(63) Continuation of application No. 14/734,746, filed on Jun. 9, 2015, now Pat. No. 9,485,001.

(60) Provisional application No. 62/073,043, filed on Oct. 31, 2014, provisional application No. 62/073,041, filed on Oct. 31, 2014.

(51) Int. Cl.
*H04B 1/16* (2006.01)
*H04B 7/08* (2006.01)
*H04B 1/00* (2006.01)
*H04B 1/04* (2006.01)

(52) U.S. Cl.
CPC ........... *H04B 7/0805* (2013.01); *H04B 1/006* (2013.01); *H04B 1/16* (2013.01); *H04B 7/0825* (2013.01); *H04B 2001/0408* (2013.01)

(58) Field of Classification Search
CPC ........................................................ H04B 7/00
See application file for complete search history.

(56) References Cited

U.S. PATENT DOCUMENTS

| 9,634,615 B1* | 4/2017 | Ahmed ................ H03F 1/0288 |
| 2004/0147230 A1* | 7/2004 | Nast ..................... H04B 1/3877 455/78 |
| 2006/0256754 A1* | 11/2006 | Liu ........................ H04B 1/005 370/335 |
| 2009/0128254 A1 | 5/2009 | Goi et al. |
| 2010/0090777 A1 | 4/2010 | Song et al. |
| 2010/0178879 A1* | 7/2010 | Sato ........................ H03F 3/195 455/78 |
| 2010/0291915 A1* | 11/2010 | Nast ..................... H04B 1/0057 455/422.1 |
| 2011/0116422 A1* | 5/2011 | Nast ..................... H04B 1/3877 370/277 |

(Continued)

FOREIGN PATENT DOCUMENTS

| EP | 2453588 A1 | 5/2012 |
| EP | 2736175 A1 | 5/2014 |

(Continued)

*Primary Examiner* — Jaison Joseph
(74) *Attorney, Agent, or Firm* — Chang & Hale LLP

(57) ABSTRACT

Switching network for diversity receivers. In some embodiments, a receiver can include an input node and an output node, and a first amplification path having a first amplifier implemented between the input node and the output node. The receiver can further include a second amplification path having a second amplifier implemented between the input node and the output node. The receiver can further include a switch implemented to selectively couple the first amplification path and the second amplification path.

20 Claims, 8 Drawing Sheets

(56) References Cited

U.S. PATENT DOCUMENTS

| | | | |
|---|---|---|---|
| 2013/0051284 A1 | 2/2013 | Khlat | |
| 2014/0015603 A1* | 1/2014 | Scott | H03F 1/56 330/126 |
| 2014/0024322 A1 | 1/2014 | Khlat | |
| 2014/0112213 A1* | 4/2014 | Norholm | H04B 1/56 370/277 |
| 2014/0227982 A1 | 8/2014 | Granger-Jones et al. | |
| 2015/0180439 A1* | 6/2015 | Reiha | H01P 1/184 333/164 |

FOREIGN PATENT DOCUMENTS

| | | |
|---|---|---|
| GB | 2512669 A | 10/2014 |
| JP | H07095100 | 7/1995 |
| JP | 2003-133928 A1 | 5/2003 |
| JP | 2009-077331 A1 | 4/2009 |
| JP | 2012-109972 A1 | 6/2012 |
| KR | 1020040100056 | 12/2004 |
| KR | 101235048 B1 | 2/2013 |
| KR | 1020130065485 | 6/2013 |
| KR | 1020140099890 | 8/2014 |
| WO | 2003090370 A1 | 10/2003 |
| WO | 2005125031 A1 | 12/2005 |
| WO | 2008133854 A1 | 11/2008 |
| WO | 2013085721 A1 | 6/2013 |

\* cited by examiner

SWITCHING NETWORK FOR DIVERSITY RECEIVERS

CROSS-REFERENCE TO RELATED APPLICATION(S)

This application is a continuation of U.S. application Ser. No. 14/734,746 filed Jun. 9, 2015, entitled DIVERSITY RECEIVER FRONT END SYSTEM WITH SWITCHING NETWORK, which claims priority to and the benefits of the filing dates of U.S. Provisional Application No. 62/073,043 filed Oct. 31, 2014, entitled DIVERSITY RECEIVER FRONT END SYSTEM, and U.S. Provisional Application No. 62/073,041, filed Oct. 31, 2014, entitled ADAPTIVE MULTIBAND LNA FOR CARRIER AGGREGATION, the benefits of the filing dates of which are hereby claimed and the disclosures of which are hereby expressly incorporated by reference herein in their entirety.

BACKGROUND

Field

The present disclosure generally relates to wireless communication systems having one or more diversity receiving antennas.

Description of the Related Art

In wireless communication applications, size, cost, and performance are examples of factors that can be important for a given product. For example, to increase performance, wireless components such as a diversity receive antenna and associated circuitry are becoming more popular.

In many radio-frequency (RF) applications, a diversity receive antenna is placed physically far from a primary antenna. When both antennas are used at once, a transceiver can process signals from both antennas in order to increase data throughput.

SUMMARY

In accordance with some implementations, the present disclosure relates to a receiving system comprising a plurality of amplifiers. Each one of the plurality of amplifiers is disposed along a corresponding one of a plurality of paths between an input of the receiving system and an output of the receiving system and is configured to amplify a signal received at the amplifier. The receive system further includes a switching network including one or more single-pole/single-throw switches. Each one of the switches couples two of the plurality of paths. The receiving system further includes a controller configured to receive a band select signal and, based on the band select signal, enable one of the plurality of amplifiers and control the switching network.

In some embodiments, the controller can be configured to, in response to receiving a band select signal indicating a single frequency band, enable one of the plurality of amplifiers corresponding the single frequency band and control the switching network to open all of the one or more switches.

In some embodiments, the controller can be configured to, in response to receiving a band select signal indicating multiple frequency bands, enable one of the plurality of amplifiers corresponding to one of the multiple frequency bands and control the switching network to close at least one of the one or more switches between paths corresponding to the multiple frequency bands.

In some embodiments, the receiving system can further include a plurality of phase-shift components. Each one of the plurality of phase-shift components can be disposed along a corresponding one of the plurality of paths and can be configured to phase-shift a signal passing through the phase-shift component to increase the impedance for the frequency band corresponding to another one of the plurality of paths. In some embodiments, each one of the plurality of phase-shift components can be disposed between the switching network and the input. In some embodiments, at least one of the plurality of phase-shift components can include a tunable phase-shift component configured to phase-shift a signal passing through the tunable phase-shift component an amount controlled by a phase-shift tuning signal received from the controller. In some embodiments, the controller can be configured to generate the phase-shift tuning signal based on the band select signal.

In some embodiments, the receiving system can further include a plurality of impedance matching components. Each one of the plurality of impedance matching components can be disposed along a corresponding one of the plurality of paths and can be configured to decrease a noise figure of the one of the plurality of paths. In some embodiments, each one of the plurality of impedance matching components can be disposed between the switching network and a corresponding one of the plurality of amplifiers. In some embodiments, at least one of the plurality of impedance matching components can include a tunable impedance matching component configured to present an impedance controlled by a impedance tuning signal received from the controller. In some embodiments, the controller can be configured to generate the impedance tuning signal based on the band select signal.

In some embodiments, the receiving system can further include a multiplexer configured to split an input signal received at the input into a plurality of signals at a respective plurality of frequency bands propagated along the plurality of paths.

In some embodiments, at least one of the plurality of amplifiers can include a dual-stage amplifier.

In some embodiment, the controller can be configured to enable one of the plurality of amplifiers and to disable the others of the plurality of amplifiers.

In some implementations, the present disclosure relates to a radio-frequency (RF) module that includes a packaging substrate configured to receive a plurality of components. The RF module further includes a receiving system implemented on the packaging substrate. The receiving system includes a plurality of amplifiers. Each one of the plurality of amplifiers is disposed along a corresponding one of a plurality of paths between an input of the receiving system and an output of the receiving system and is configured to amplify a signal received at the amplifier. The receiving system further includes a switching network including one or more single-pole/single-throw switches. Each one of the switches couples two of the plurality of paths. The receiving system further includes a controller configured to receive a band select signal and, based on the band select signal, enable one of the plurality of amplifiers and control the switching network.

In some embodiments, the RF module can be a diversity receiver front-end module (FEM).

In some embodiments, the receiving system can further include a plurality of phase-shift components. Each one of the plurality of phase-shift components can be disposed along a corresponding one of the plurality of paths and can be configured to phase-shift a signal passing through the phase-shift component to increase the impedance for the frequency band corresponding to another one of the plurality of paths.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a plurality of amplifiers. Each one of the plurality of amplifiers is disposed along a corresponding one of a plurality of paths between an input of the receiving system and an output of the receiving system and is configured to amplify a signal received at the amplifier. The receiving system further includes a switching network including one or more single-pole/single-throw switches. Each one of the switches couples two of the plurality of paths. The receiving system further includes a controller configured to receive a band select signal and, based on the band select signal, enable one of the plurality of amplifiers and control the switching network. The wireless device further includes a transceiver configured to receive a processed version of the first RF signal from the output via a cable and generate data bits based on the processed version of the first RF signal.

In some implementations, the wireless device can further include a second antenna configured to receive a second radio-frequency (RF) signal and a second FEM in communication with the first antenna. The transceiver can be configured to receive a processed version of the second RF signal from an output of the second FEM and generate the data bits based on the processed version of the second RF signal.

In some implementations, the receiving system can further include a plurality of phase-shift components. Each one of the plurality of phase-shift components can be disposed along a corresponding one of the plurality of paths and can be configured to phase-shift a signal passing through the phase-shift component to increase the impedance for the frequency band corresponding to another one of the plurality of paths.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
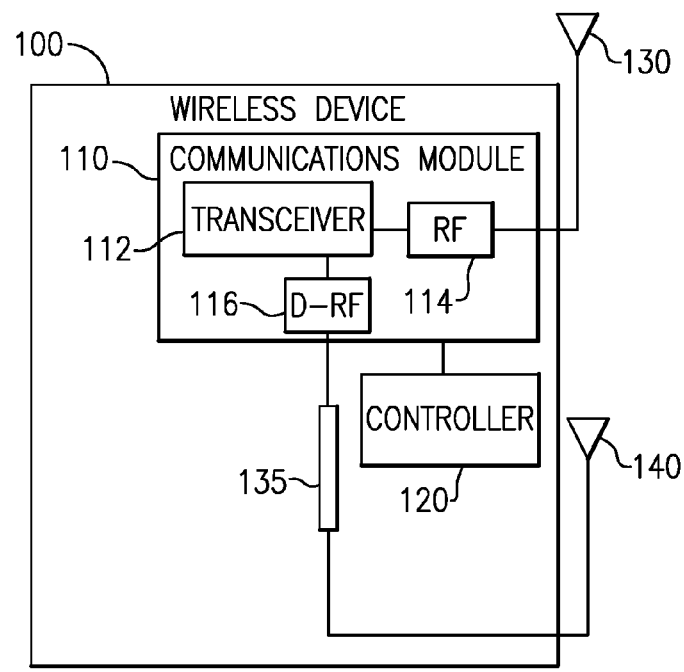
FIG. 1 shows a wireless device having a communications module coupled to a primary antenna and a diversity antenna.

FIG. 1 shows a wireless device 100 having a communications module 110 coupled to a primary antenna 130 and a diversity antenna 140. The communications module 110 (and its constituent components) may be controlled by a controller 120. The communications module 110 includes a transceiver 112 that is configured to convert between analog radio-frequency (RF) signals and digital data signals. To that end, the transceiver 112 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The communications module 110 further includes an RF module 114 coupled between the primary antenna 130 and the transceiver 112. Because the RF module 114 may be physically close to the primary antenna 130 to reduce attenuation due to cable loss, the RF module 114 may be referred to as front-end module (FEM). The RF module 114 may perform processing on an analog signal received from the primary antenna 130 for the transceiver 112 or received from transceiver 112 for transmission via the primary antenna 130. To that end, the RF module 114 may include filters, power amplifiers, band select switches, matching circuits, and other components. Similarly, the communications module 110 includes a diversity RF module 116 coupled between the diversity antenna 140 and the transceiver 112 that performs similar processing.

When a signal is transmitted to the wireless device, the signal may be received at both the primary antenna 130 and the diversity antenna 140. The primary antenna 130 and diversity antenna 140 may be physically spaced apart such that the signal at the primary antenna 130 and diversity antenna 140 is received with different characteristics. For example, in one embodiment, the primary antenna 130 and diversity antenna 140 may receive the signal with different attenuation, noise, frequency response, or phase shift. The transceiver 112 may use both of the signals with different characteristics to determine data bits corresponding to the signal. In some implementations, the transceiver 112 selects from between the primary antenna 130 and the diversity antenna 140 based on the characteristics, such as selecting the antenna with the highest signal-to-noise ratio. In some implementations, the transceiver 112 combines the signals from the primary antenna 130 and the diversity antenna 140 to increase the signal-to-noise ratio of the combined signal. In some implementations, the transceiver 112 processes the signals to perform multiple-input/multiple-output (MIMO) communication.

Because the diversity antenna 140 is physically spaced apart from the primary antenna 130, the diversity antenna 140 is coupled to the communications module 110 by transmission line 135, such as a cable or a printed circuit board (PCB) trace. In some implementations, the transmission line 135 is lossy and attenuates the signal received at the diversity antenna 140 before it reaches the communications module 110. Thus, in some implementations, as described below, gain is applied to the signal received at the diversity antenna 140. The gain (and other analog processing, such as filtering) may be applied by a diversity receiver module. Because such a diversity receiver module may be located physically close to the diversity antenna 140, it may be referred to a diversity receiver front-end module.

Figure 2:
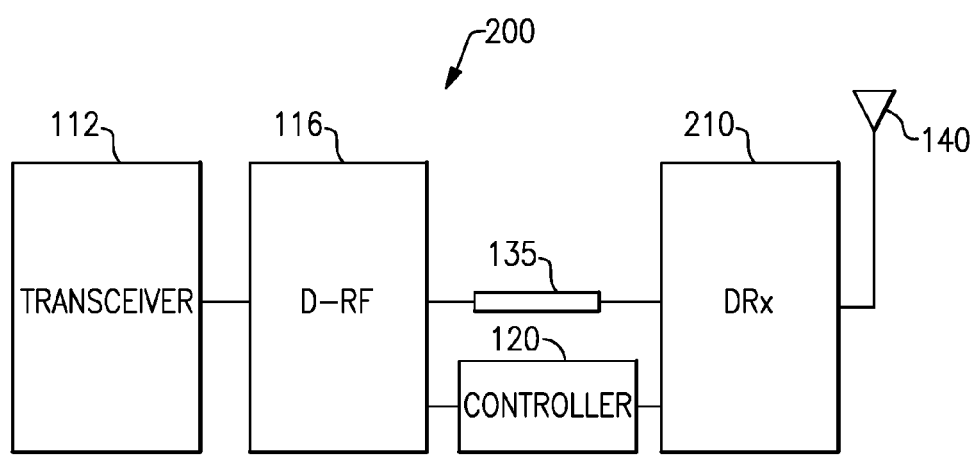
FIG. 2 shows a diversity receiver (DRx) configuration including a DRx front-end module (FEM).

FIG. 2 shows a diversity receiver (DRx) configuration 200 including a DRx front-end module (FEM) 210. The DRx configuration 200 includes a diversity antenna 140 that is configured to receive a diversity signal and provide the diversity signal to the DRx FEM 210. The DRx FEM 210 is configured to perform processing on the diversity signal received from the diversity antenna 140. For example, the DRx FEM 210 may be configured to filter the diversity signal to one or more active frequency bands, e.g., as indicated by the controller 120. As another example, the DRx FEM 210 may be configured to amplify the diversity signal. To that end, the DRx FEM 210 may include filters, low-noise amplifiers, band select switches, matching circuits, and other components.

The DRx FEM 210 transmits the processed diversity signal via a transmission line 135 to a downstream module, such as the diversity RF (D-RF) module 116, which feeds a further processed diversity signal to the transceiver 112. The diversity RF module 116 (and, in some implementations, the transceiver), is controlled by the controller 120. In some implementations, the controller 120 may be implemented within the transceiver 112.

Figure 3:
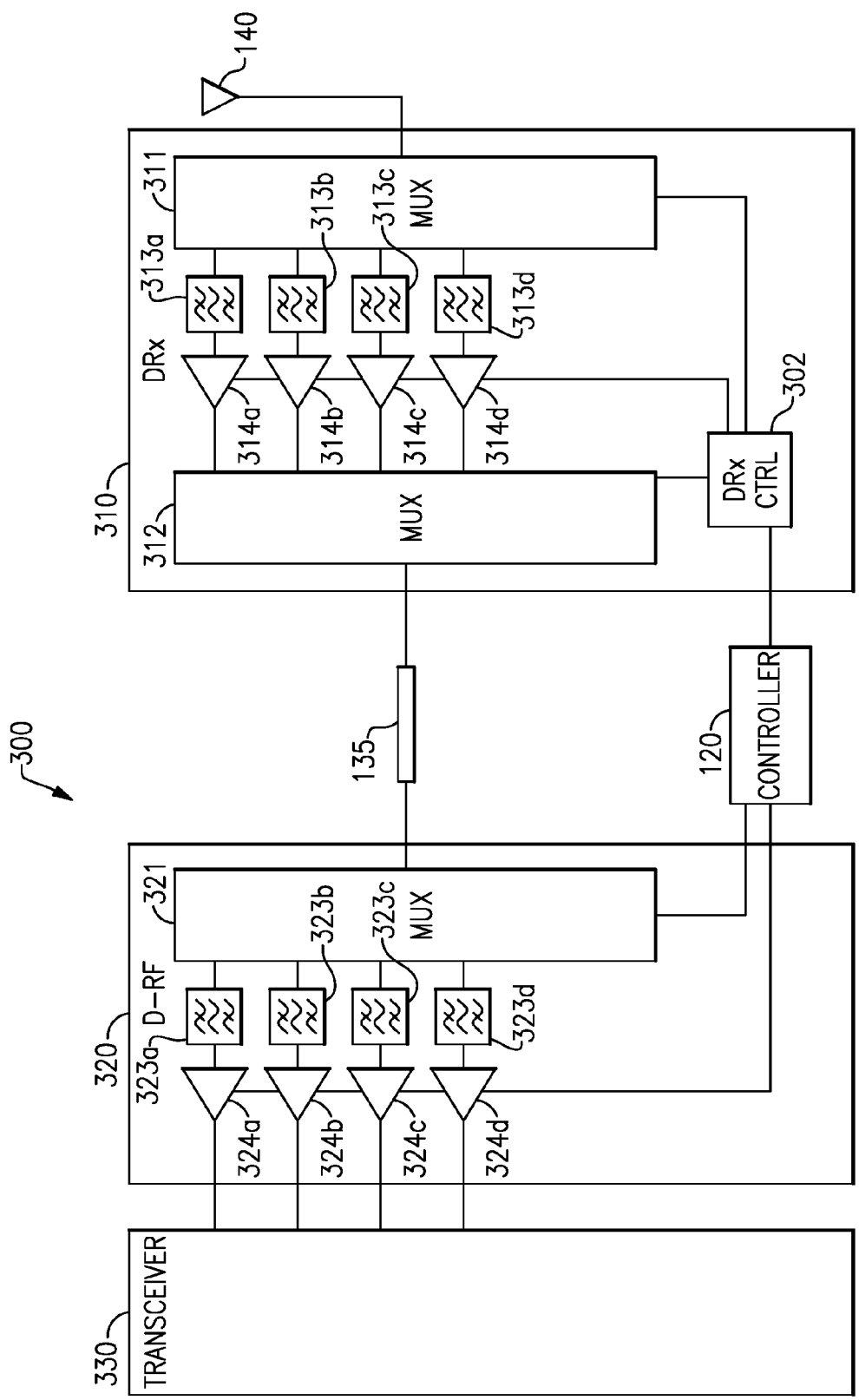
FIG. 3 shows that in some embodiments, a diversity receiver (DRx) configuration may include a DRx module with multiple paths corresponding to multiple frequency bands.

FIG. 3 shows that in some embodiments, a diversity receiver (DRx) configuration 300 may include a DRx module 310 with multiple paths corresponding to multiple frequency bands. The DRx configuration 300 includes a diversity antenna 140 configured to receive a diversity signal. In some implementations, the diversity signal may be a single-band signal including data modulated onto a single frequency band. In some implementations, the diversity signal may be a multi-band signal (also referred to as an inter-band carrier aggregation signal) including data modulated onto multiple frequency bands.

The DRx module 310 has an input that receives the diversity signal from the diversity antenna 140 and an output that provides a processed diversity signal to the transceiver 330 (via the transmission line 135 and the diversity RF module 320). The DRx module 310 input feeds into an input of first multiplexer 311. The first multiplexer (MUX) 311 includes a plurality of multiplexer outputs, each corresponding to a path between the input and the output of the DRx module 310. Each of the paths may correspond to a respective frequency band. The DRx module 310 output is provided by the output of second multiplexer 312. The second multiplexer 312 includes a plurality of multiplexer inputs, each corresponding to one of the paths between the input and the output of the DRx module 310.

The frequency bands may be cellular frequency bands, such as UMTS (Universal Mobile Telecommunications System) frequency bands. For example, a first frequency band may be UMTS downlink or "Rx" Band 2, between 1930 megahertz (MHZ) and 1990 MHz, and a second frequency band may be UMTS downlink or "Rx" Band 5, between 869 MHz and 894 MHz. Other downlink frequency bands may be used, such as those described below in Table 1 or other non-UMTS frequency bands.

In some implementations, the DRx module 310 includes a DRx controller 302 that receives signals from the controller 120 (also referred to as a communications controller) and, based on the received signals, selectively activates one or more of the plurality of paths between the input and the output. In some implementations, the DRx module 310 does not include a DRx controller 302 and the controller 120 selectively activates the one or more of the plurality of paths directly.

As noted above, in some implementations, the diversity signal is a single-band signal. Thus, in some implementations, the first multiplexer 311 is a single-pole/multiple-throw (SPMT) switch that routes the diversity signal to one of the plurality of paths corresponding to the frequency band of the single-band signal based on a signal received from the DRx controller 302. The DRx controller 302 may generate the signal based on a band select signal received by the DRx controller 302 from the communications controller 120. Similarly, in some implementations, the second multiplexer 312 is a SPMT switch that routes the signal from the one of the plurality of paths corresponding to the frequency band of the single-band signal based on a signal received from the DRx controller 302.

As noted above, in some implementations, the diversity signal is a multi-band signal. Thus, in some implementations, the first multiplexer 311 is a signal splitter that routes the diversity signal to two or more of the plurality of paths corresponding to the two or more frequency bands of the multi-band signal based on a splitter control signal received from the DRx controller 302. The function of the signal splitter may be implemented as a SPMT switch, a diplexer filter, or some combination of these. Similarly, in some implementations, the second multiplexer 312 is a signal combiner that combines the signals from the two or more of the plurality of paths corresponding to the two or more frequency bands of the multi-band signal based on a combiner control signal received from the DRx controller 302. The function of the signal combiner may be implemented as a SPMT switch, a diplexer filter, or some combination of these. The DRx controller 302 may generate the splitter control signal and the combiner control signal based on a band select signal received by the DRx controller 302 from the communications controller 120.

Thus, in some implementations, the DRx controller 302 is configured to selectively activate one or more of the plurality of paths based on a band select signal received by the DRx controller 302 (e.g., from the communications controller 120). In some implementations, the DRx controller 302 is configured to selectively activate one or more of the plurality of paths by transmitting a splitter control signal to a signal splitter and a combiner control signal to a signal combiner.

The DRx module 310 includes a plurality of bandpass filters 313a-313d. Each one of the bandpass filters 313a-313d is disposed along a corresponding one of the plurality of paths and configured to filter a signal received at the bandpass filter to the respective frequency band of the one of the plurality of paths. In some implementations, the bandpass filters 313a-313d are further configured to filter a signal received at the bandpass filter to a downlink frequency sub-band of the respective frequency band of the one of the plurality of paths. The DRx module 310 includes a plurality of amplifiers 314a-314d. Each one of the amplifiers 314a-314d is disposed along a corresponding one of the plurality of paths and configured to amplify a signal received at the amplifier.

In some implementations, the amplifiers 314a-314d are narrowband amplifiers configured to amplify a signal within the respective frequency band of the path in which the amplifier is disposed. In some implementations, the amplifiers 314a-314d are controllable by the DRx controller 302. For example, in some implementations, each of the amplifiers 314a-314d includes an enable/disable input and is enabled (or disabled) based on an amplifier enable signal received and the enable/disable input. The amplifier enable signal may be transmitted by the DRx controller 302. Thus, in some implementations, the DRx controller 302 is configured to selectively activate one or more of the plurality of paths by transmitting an amplifier enable signal to one or more of the amplifiers 314a-314d respectively disposed along the one or more of the plurality of paths. In such implementations, rather than being controlled by the DRx controller 302, the first multiplexer 311 may be a signal splitter that routes the diversity signal to each of the plurality of paths and the second multiplexer 312 may be a signal combiner that combines the signals from each of the plurality of paths. However, in implementations in which the DRx controller 302 controls the first multiplexer 311 and second multiplexer 312, the DRX controller 302 may also enable (or disable) particular amplifiers 314a-314d, e.g., to save battery.

In some implementations, the amplifiers 314a-314d are variable-gain amplifiers (VGAs). Thus, the some implementations, the DRx module 310 includes a plurality of variable-gain amplifiers (VGAs), each one of the VGAs disposed along a corresponding one of the plurality of paths and configured to amplify a signal received at the VGA with a gain controlled by an amplifier control signal received from the DRx controller 302.

The gain of a VGA may be bypassable, step-variable, continuously-variable. In some implementations, at least one of the VGAs includes a fixed-gain amplifier and a bypass switch controllable by the amplifier control signal. The bypass switch may (in a first position) close a line between an input of the fixed-gain amplifier to an output of fixed-gain amplifier, allowing a signal to bypass the fixed-gain amplifier. The bypass switch may (in a second position) open the line between the input and the output, passing a signal through the fixed-gain amplifier. In some implementations, when the bypass switch is in the first position, the fixed-gain amplifier is disabled or otherwise reconfigured to accommodate the bypass mode.

In some implementations, at least one of the VGAs includes a step-variable gain amplifier configured to amplify the signal received at the VGA with a gain of one of plurality of configured amounts indicated by the amplifier control signal. In some implementations, at least one of the VGAs includes a continuously-variable gain amplifier configured to amplify a signal received at the VGA with a gain proportional to the amplifier control signal.

In some implementations, the amplifiers 314a-314d are variable-current amplifiers (VCAs). The current drawn by a VCA may be bypassable, step-variable, continuously-variable. In some implementations, at least one of the VCAs includes a fixed-current amplifier and a bypass switch controllable by the amplifier control signal. The bypass switch may (in a first position) close a line between an input of the fixed-current amplifier to an output of fixed-current amplifier, allowing a signal to bypass the fixed-current amplifier. The bypass switch may (in a second position) open the line between the input and the output, passing a signal through the fixed-current amplifier. In some implementations, when the bypass switch is in the first position, the fixed-current amplifier is disabled or otherwise reconfigured to accommodate the bypass mode.

In some implementations, at least one of the VCAs includes a step-variable current amplifier configured to amplify the signal received at the VCA by drawing a current of one of plurality of configured amounts indicated by the amplifier control signal. In some implementations, at least one of the VCAs includes a continuously-variable current amplifier configured to amplify a signal received at the VCA by drawing a current proportional to the amplifier control signal.

In some implementations, the amplifiers 314a-314d are fixed-gain, fixed-current amplifiers. In some implementations, the amplifiers 314a-314d are fixed-gain, variable-current amplifiers. In some implementations, the amplifiers 314a-314d are variable-gain, fixed-current amplifiers. In some implementations, the amplifiers 314a-314d are variable-gain, variable-current amplifiers.

In some implementations, the DRx controller 302 generates the amplifier control signal(s) based on a quality of service metric of an input signal received at the input. In some implementations, the DRx controller 302 generates the amplifier control signal(s) based on a signal received from the communications controller 120, which may, in turn, be based on a quality of service (Qos) metric of the received signal. The QoS metric of the received signal may be based, at least in part, on the diversity signal received on the diversity antenna 140 (e.g., an input signal received at the input). The QoS metric of the received signal may be further based on a signal received on a primary antenna. In some implementations, the DRx controller 302 generates the amplifier control signal(s) based on a QoS metric of the diversity signal without receiving a signal from the communications controller 120.

In some implementations, the QoS metric includes a signal strength. As another example, the QoS metric may include a bit error rate, a data throughput, a transmission delay, or any other QoS metric.

As noted above, the DRx module 310 has an input that receives the diversity signal from the diversity antenna 140 and an output that provides a processed diversity signal to the transceiver 330 (via the transmission line 135 and the diversity RF module 320). The diversity RF module 320 receives the processed diversity signal via the transmission line 135 and performs further processing. In particular, the processed diversity signal is split or routed by a diversity RF multiplexer 321 to one or more paths on which the split or routed signal is filtered by corresponding bandpass filters 323a-323d and amplified by corresponding amplifiers 324a-324d. The output of each of the amplifiers 324a-324d is provided to the transceiver 330.

The diversity RF multiplexer 321 may be controlled by the controller 120 (either directly or via or an on-chip diversity RF controller) to selectively activate one or more of the paths. Similarly, the amplifiers 324a-324d may be controlled by the controller 120. For example, in some implementations, each of the amplifiers 324a-324d includes an enable/disable input and is enabled (or disabled) based on an amplifier enable signal. In some implementations, the amplifiers 324a-324d are variable-gain amplifiers (VGAs) that amplify a signal received at the VGA with a gain controlled by an amplifier control signal received from the controller 120 (or an on-chip diversity RF controller controlled by the controller 120). In some implementations, the amplifiers 324a-324d are variable-current amplifiers (VCAs).

With the DRx module 310 added to the receiver chain already including the diversity RF module 320, the number of bandpass filters in the DRx configuration 300 is doubled. Thus, in some implementations, bandpass filters 323a-323d are not included in the diversity RF module 320. Rather, the bandpass filters 313a-313d of the DRx module 310 are used to reduce the strength of out-of-band blockers. Further, the automatic gain control (AGC) table of the diversity RF module 320 may be shifted to reduce the amount of gain provided by the amplifiers 324a-324d of the diversity RF module 320 by the amount of the gain provided by the amplifiers 314a-314d of the DRx module 310.

For example, if the DRx module gain is 15 dB and the receiver sensitivity is −100 dBm, the diversity RF module 320 will see −85 dBm of sensitivity. If the closed-loop AGC of the diversity RF module 320 is active, its gain will drop by 15 dB automatically. However, both signal components and out-of-band blockers are received amplified by 15 dB. Thus, the 15 dB gain drop of the diversity RF module 320 may also be accompanied by a 15 dB increase in its linearity. In particular, the amplifiers 324a-324d of the diversity RF module 320 may be designed such that the linearity of the amplifiers increases with reduced gain (or increased current).

In some implementations, the controller 120 controls the gain (and/or current) of the amplifiers 314a-314d of the DRx module 310 and the amplifiers 324a-324d of the diversity RF module 320. As in the example above, the controller 120 may reduce an amount of gain provided by the amplifiers 324a-324d of the diversity RF module 320 in response to increasing an amount of gain provided by the amplifiers 314a-314d of the DRx module 310. Thus, in some implementations, the controller 120 is configured to generate a downstream amplifier control signal (for the amplifiers 324a-324d of the diversity RF module 320) based on the amplifier control signal (for the amplifiers 314a-314d of the DRx module 310) to control a gain of one or more downstream amplifiers 324a-324d coupled to the output (of the DRx module 310) via the transmission line 135. In some implementations, the controller 120 also controls the gain of other components of the wireless device, such as amplifiers in the front-end module (FEM), based on the amplifier control signal.

As noted above, in some implementations, the bandpass filters 323a-323d are not included. Thus, in some implementations, at least one of the downstream amplifiers 324a-324d are coupled to the output (of the DRx module 310) via the transmission line 135 without passing through a downstream bandpass filter.

Figure 4:
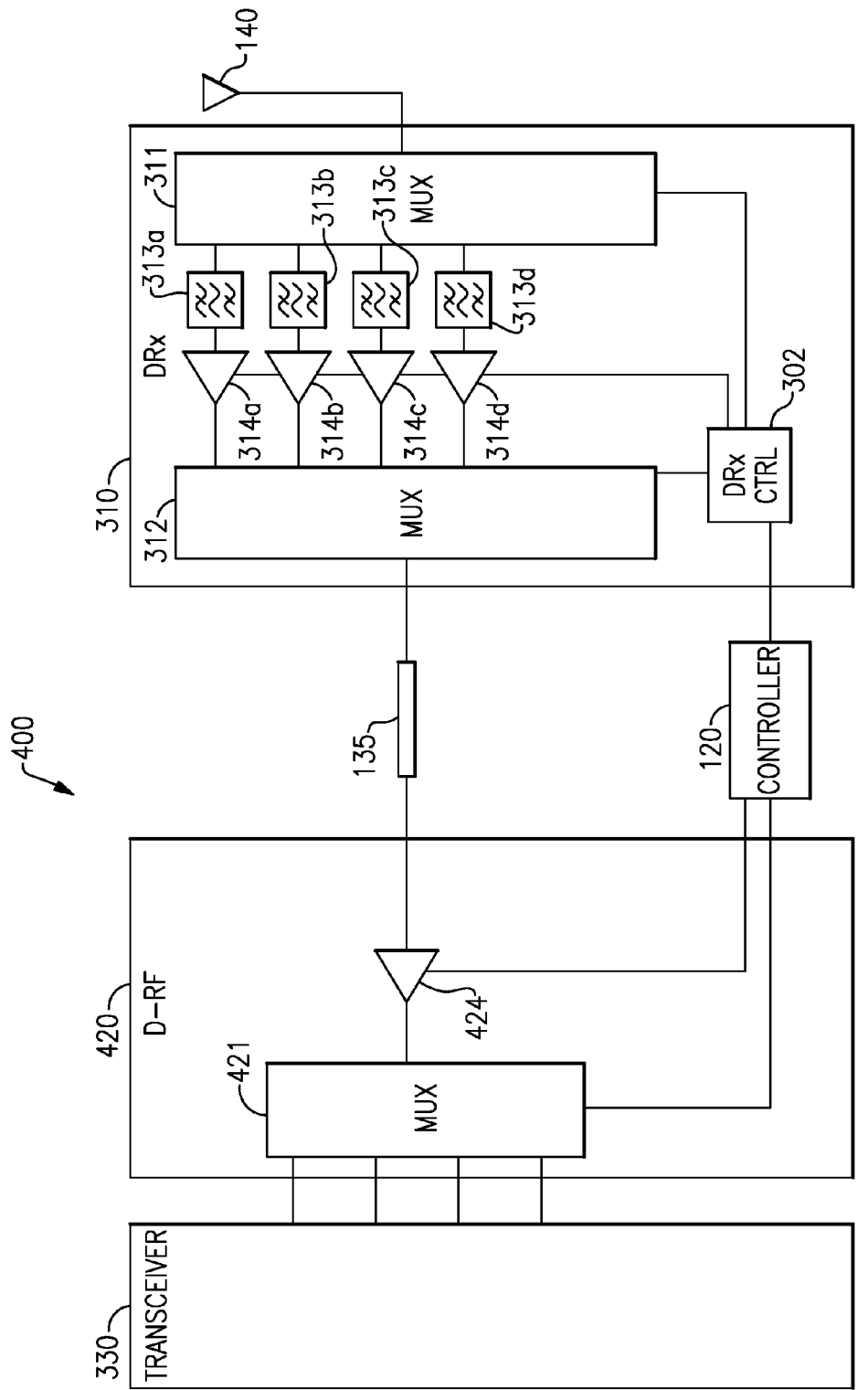
FIG. 4 shows that in some embodiments, a diversity receiver configuration may include a diversity RF module with fewer amplifiers than a diversity receiver (DRx) module.

FIG. 4 shows that in some embodiments, a diversity receiver configuration 400 may include a diversity RF module 420 with fewer amplifiers than a diversity receiver (DRx) module 310. The diversity receiver configuration 400 includes a diversity antenna 140 and a DRx module 310 as described above with respect to FIG. 3. The output of the DRx module 310 is passed, via a transmission line 135, to a diversity RF module 420 which differs from the diversity RF module 320 of FIG. 3 in that the diversity RF module 420 of FIG. 4 includes fewer amplifiers than the DRx module 310.

As mentioned above, in some implementations, the diversity RF module 420 does not include bandpass filters. Thus, in some implementations, the one or more amplifiers 424 of the diversity RF module 420 need not be band-specific. In particular, the diversity RF module 420 may include one or more paths, each including an amplifier 424, that are not mapped 1-to-1 with the paths DRx module 310. Such a mapping of paths (or corresponding amplifiers) may be stored in the controller 120.

Accordingly, whereas the DRx module 310 includes a number of paths, each corresponding to a frequency band, the diversity RF module 420 may include one or more paths that do not correspond to a single frequency band.

In some implementations (as shown in FIG. 4), the diversity RF module 420 includes a single wide-band amplifier 424 that amplifies the signal received from the transmission line 135 and outputs an amplified signal to a multiplexer 421. The multiplexer 421 includes a plurality of multiplexer outputs, each corresponding to a respective frequency band. In some implementations, the diversity RF module 420 does not include any amplifiers.

In some implementations, the diversity signal is a single-band signal. Thus, in some implementations, the multiplexer 421 is a SPMT switch that routes the diversity signal to one of the plurality of outputs corresponding to the frequency band of the single-band signal based on a signal received from the controller 120. In some implementations, the diversity signal is a multi-band signal. Thus, in some implementations, the multiplexer 421 is a signal splitter that routes the diversity signal to two or more of the plurality of outputs corresponding to the two or more frequency bands of the multi-band signal based on a splitter control signal received from the controller 120. In some implementations, diversity RF module 420 may be combined with the transceiver 330 as a single module.

In some implementations, the diversity RF module 420 includes multiple amplifiers, each corresponding to a set of frequency bands. The signal from the transmission line 135 may be fed into a band splitter that outputs high frequencies along a first path to a high-frequency amplifier and outputs low frequencies along a second path to a low-frequency amplifier. The output of each of the amplifiers may be provided to the multiplexer 421 which is configured to route the signal to the corresponding inputs of the transceiver 330.

Figure 5:
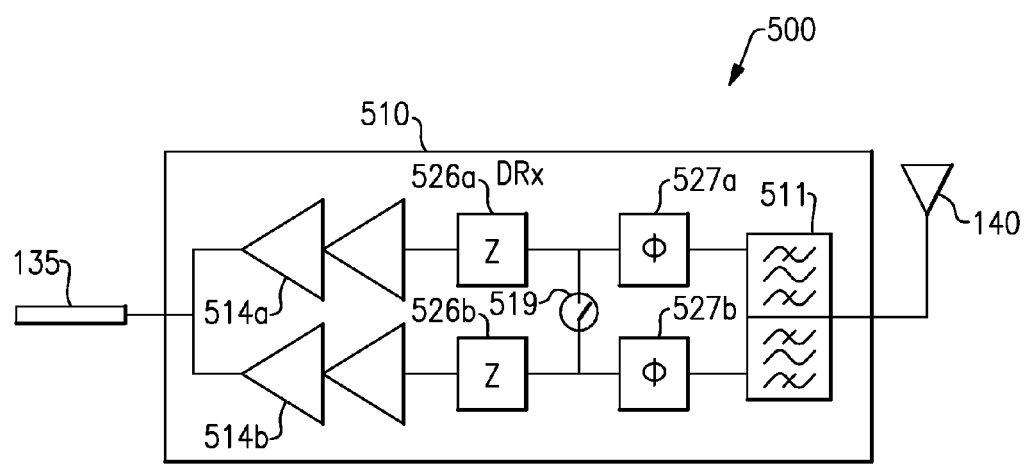
FIG. 5 shows that in some embodiments, a diversity receiver configuration may include a DRx module with a single-pole/single-throw switch.

FIG. 5 shows that in some embodiments, a diversity receiver configuration 500 may include a DRx module 510 with a single-pole/single-throw switch 519. The DRx module 510 includes two paths from an input of the DRx module 510, coupled to an antenna 140, and an output of the DRx module 510, coupled to a transmission line 135. The DRx module 510 includes a plurality of amplifiers 514a-514b, each one of the plurality of amplifiers 514a-514b disposed along a corresponding one of the plurality of paths and configured to amplify a signal received at the amplifier. In some implementations, as shown in FIG. 5, at least one of the plurality of amplifiers includes a dual-stage amplifier.

In the DRx module 510 of FIG. 5, the signal splitter and bandpass filters are implemented as a diplexer 511. The diplexer 511 includes an input coupled to the antenna 140, a first output coupled to a phase-shift component 527a disposed along a first path, and a second output coupled to a second phase-shift component 527b disposed along a second path. At the first output, the diplexer 511 outputs a signal received at the input (e.g., from the antenna 140) filtered to a first frequency band. At the second output, the diplexer 511 outputs the signal received at the input filtered to a second frequency band. In some implementations, the diplexer 511 may be replaced with a triplexer, a quadplexer, or any other multiplexer configured to split an input signal received at the input of the DRx module 510 into a plurality of signals at a respective plurality of frequency bands propagated along a plurality of paths.

In some implementations, an output multiplexer or other signal combiner disposed at the output of a DRx module, such as the second multiplexer 312 of FIG. 3, may degrade the performance of the DRx module when receiving a single-band signal. For example, the output multiplexer may attenuate or introduce noise to the single-band signal. In some implementations, when multiple amplifiers, such as the amplifiers 314a-314d of FIG. 3, are enabled at the same time to support a multi-band signal, each amplifier may each introduce not only in-band noise, but out-of-band noise for each of the other multiple bands.

The DRx module 510 of FIG. 5 addresses some of these challenges. The DRx module 510 includes a single-pole/single-throw (SPST) switch 519 coupling the first path to the second path. To operate in a single-band mode for the first frequency band, the switch 519 is placed in an open position, the first amplifier 514a is enabled, and the second amplifier 514b is disabled. Thus, the single-band signal at the first frequency band propagates along the first path from the antenna 140 to the transmission line 135 without switching loss. Similarly, to operate in a single-band mode for the second frequency band, the switch 519 is placed in an open position, the first amplifier 514a is disabled, and the second amplifier 514b is enabled. Thus, the single-band signal at the second frequency band propagates along the second path from the antenna 140 to the transmission line 135 without switching loss.

To operate in a multi-band mode for the first frequency band and the second frequency band, the switch 519 is placed in a closed position, the first amplifier 514a is enabled, and the second amplifier 514b is disabled. Thus, the first frequency band portion of the multi-band signal propagates along the first path through a first phase-shift component 527a, a first impedance matching component 526a, and the first amplifier 514a. The first frequency band portion is prevented from traversing the switch 519 and reverse propagating along the second path by the second phase-shift component 527b. In particular, the second phase-shift component 527a is configured to phase-shift the first frequency band portion of a signal passing through the second phase-shift component 527b so as to maximize (or at least increase) the impedance at the first frequency band.

The second frequency band portion of the multi-band signal propagates along the second path through a second phase-shift component 527b, traverses the switch 519, and propagates along the first path through the first impedance matching component 526a and the first amplifier 314a. The second frequency band portion is prevented from reverse propagating along the first path by the first phase-shift component 527a. In particular, the first phase-shift component 527a is configured to phase-shift the second frequency band portion of a signal passing through the first phase-shift component 527a so as to maximize (or at least increase) the impedance at the second frequency band.

Each of the paths may be characterized by a noise figure and a gain. The noise figure of each path is a representation of the degradation of the signal-to-noise ratio (SNR) caused by the amplifier and impedance matching component 526a-526b disposed along the path. In particular, the noise figure of each path is the difference in decibels (dB) between the SNR at the input of the impedance matching component 526a-526b and the SNR at the output of the amplifier 314a-314b. Thus, the noise figure is a measure of the difference between the noise output of the amplifier to the noise output of an "ideal" amplifier (that does not produce noise) with the same gain.

The noise figure of each path may be different for different frequency bands. For example, the first path may have a first noise figure for the first frequency band and a second noise figure for the second frequency band. The noise figure and gain of each path (at each frequency band) may depend, at least in part, on the impedance (at each frequency band) of the impedance matching component 526a-526b. Accordingly, it may be advantageous that the impedance of the impedance matching component 526a-526b is such that the noise figure of each path is minimized (or reduced).

In some implementations, the second impedance matching component 526b presents an impedance that minimizes (or decreases) the noise figure for the second frequency band. In some implementations, the first impedance matching component 526a minimizes (or decreases) the noise figure for the first frequency band. As the second frequency band portion of a multi-band signal may be partially propagated along the first part, in some implementations, the first impedance matching component 526a minimizes (or decreases) a metric including the noise figure for the first band and the noise figure for the second band.

The impedance matching components 526a-526b may be implemented as passive circuits. In particular, the impedance matching components 526a-526b may be implemented as RLC circuits and include one or more passive components, such as resistors, inductors and/or capacitors. The passive components may be connected in parallel and/or in series and may be connected between the outputs of the phase-shift components 527a-527b and the inputs of the amplifiers 514a-415b or may be connected between the outputs of the phase-shift components 527a-527b and a ground voltage.

Similarly, the phase-shift components 527a-527b may be implemented as passive circuits. In particular, the phase-shift components 527a-527b may be implemented as LC circuits and include one or more passive components, such as inductors and/or capacitors. The passive components may be connected in parallel and/or in series and may be connected between the outputs of the diplexer 511 and the inputs of the impedance matching components 526a-526b or may be connected between the outputs of the diplexer 511 and a ground voltage.

Figure 6:
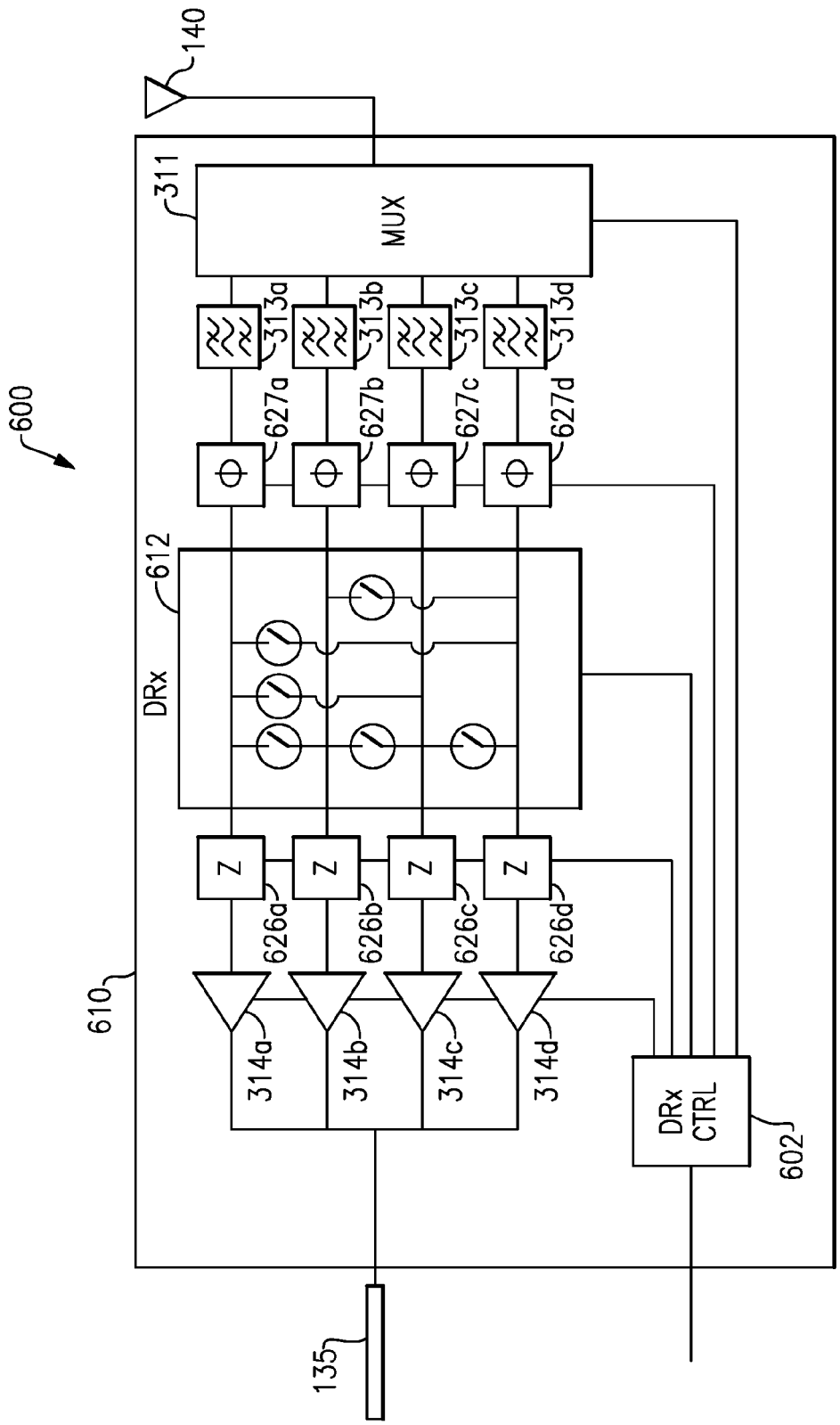
FIG. 6 shows that in some embodiments, a diversity receiver configuration may include a DRx module with tunable phase-shift components.

FIG. 6 shows that in some embodiments, a diversity receiver configuration 600 may include a DRx module 610 with tunable phase-shift components 627a-627d. Each of the tunable phase-shift components 627a-627d may be configured to phase-shift a signal passing through the tunable phase-shift component an amount controlled by a phase-shift tuning signal received from the controller.

The diversity receiver configuration 600 includes a DRx module 610 having an input coupled to an antenna 140 and an output coupled to a transmission line 135. The DRx module 610 includes a number of paths between the input and the output of the DRx module 610. Each of the paths includes a multiplexer 311, a bandpass filter 313a-313d, a tunable phase-shift component 627a-627d, a switching network 612, a tunable impedance matching component 626a-626d, and an amplifier 314a-314d. As described above, the amplifiers 314a-314d may be variable-gain amplifiers and/or variable-current amplifiers.

The tunable phase-shift components 627a-627d may include one or more variable components, such as inductors and capacitors. The variable components may be connected in parallel and/or in series and may be connected between the outputs of the multiplexer 311 and the inputs of the switching network 612 or may be connected between the outputs of the multiplexer and a ground voltage.

The tunable impedance matching components 626a-626d may be a tunable T-circuit, a tunable PI-circuit, or any other tunable matching circuit. The tunable impedance matching components 626a-626d may include one or more variable components, such as resistors, inductors, and capacitors. The variable components may be connected in parallel and/or in series and may be connected between the outputs of the switching network 612 and the inputs of the amplifiers 314a-314d or may be connected between the outputs of the switching network 612 and a ground voltage.

The DRx controller 602 is configured to selectively activate one or more of the plurality of paths between the input and the output. In some implementations, the DRx controller 602 is configured to selectively activate one or more of the plurality of paths based on a band select signal received by the DRx controller 602 (e.g., from a communications controller). The DRx controller 602 may selectively activate the paths by, for example, enabling or disabling the amplifiers 314a-314d, controlling the multiplexer 311 and/or the switching network 612, or through other mechanisms.

In some implementations, the DRx controller 602 controls the switching network 612 based on the band select signal. The switching network includes a plurality of SPST switches, each switch coupling two of the plurality of paths. The DRx controller 602 may send a switching signal (or multiple switching signals) to the switching network to open or close the plurality of SPST switches. For example, if the band select signal indicates that an input signal includes a first frequency band and a second frequency band, the DRx controller 602 may close a switch between the first path and the second path. If the band select signal indicates that an input signal includes a second frequency band and a fourth frequency band, the DRx controller 602 may close a switch between the second path and the fourth path. If the band select signal indicates that an input signal includes the first frequency band, the second frequency band, and the fourth frequency band, the DRx controller 602 may close the both of the switches (and/or close the switch between the first path and the second path and a switch between first path and the fourth path). If the band select signal indicates that an input signal includes the second frequency band, the third frequency band, and the fourth frequency, the DRx controller 602 may close a switch between the second path and the third path and a switch between the third path and the fourth path (and/or close the switch between the second path and the third path and a switch between the second path and the fourth path).

In some implementations, the DRx controller 602 is configured to tune the tunable phase-shift components 627a-627d. In some implementations, the DRx controller 602 tunes the tunable phase-shift components 627a-627d based on the band select signal. For example, the DRx controller 602 may tune the tunable phase-shift components 627a-627d based on a lookup table that associates frequency bands (or sets of frequency bands) indicated by the band select signal with tuning parameters. Accordingly, in response to a band select signal, the DRx controller 602 may transmit a phase-shift tuning signal to the tunable phase-shift component 627a-627d of each active path to tune the tunable phase-shift component (or the variable components thereof) according to the tuning parameters.

The DRx controller 602 may be configured to tune the tunable phase-shift components 627a-627d of each active path so as to maximize (or at least increase) the impedance at frequency bands corresponding to the other active paths. Thus, if the first path and the third path are active, the DRx controller 602 may tune the first phase-shift component 627a so as to maximize (or at least increase) the impedance at the third frequency band, whereas, if the first path and the fourth path are active, the DRx controller 602 may tune the first phase-shift component 627a so as to maximize (or at least increase) the impedance at the fourth frequency band.

In some implementations, the DRx controller 602 is configured to tune the tunable impedance matching components 626a-626d. In some implementations, the DRx controller 602 tunes the tunable impedance matching components 626a-626d based on the band select signal. For example, the DRx controller 602 may tune the tunable impedance matching components 626a-626d based on a lookup table that associates frequency bands (or sets of frequency bands) indicated by the band select signal with tuning parameters. Accordingly, in response to a band select signal, the DRx controller 602 may transmit an impedance tuning signal to the tunable impedance matching component 626a-626d of the path having an active amplifier according to the tuning parameters.

In some implementations, the DRx controller 602 tunes the tunable impedance matching components 626a-626d of the path having an active amplifier to minimize (or reduce) a metric including the noise figure for the corresponding frequency band of each active path.

In various implementations, one or more of the tunable phase-shift components 627a-627d or tunable impedance matching components 626a-626d may be replaced by fixed components that are not controlled by the DRx controller 602.

Figure 7:
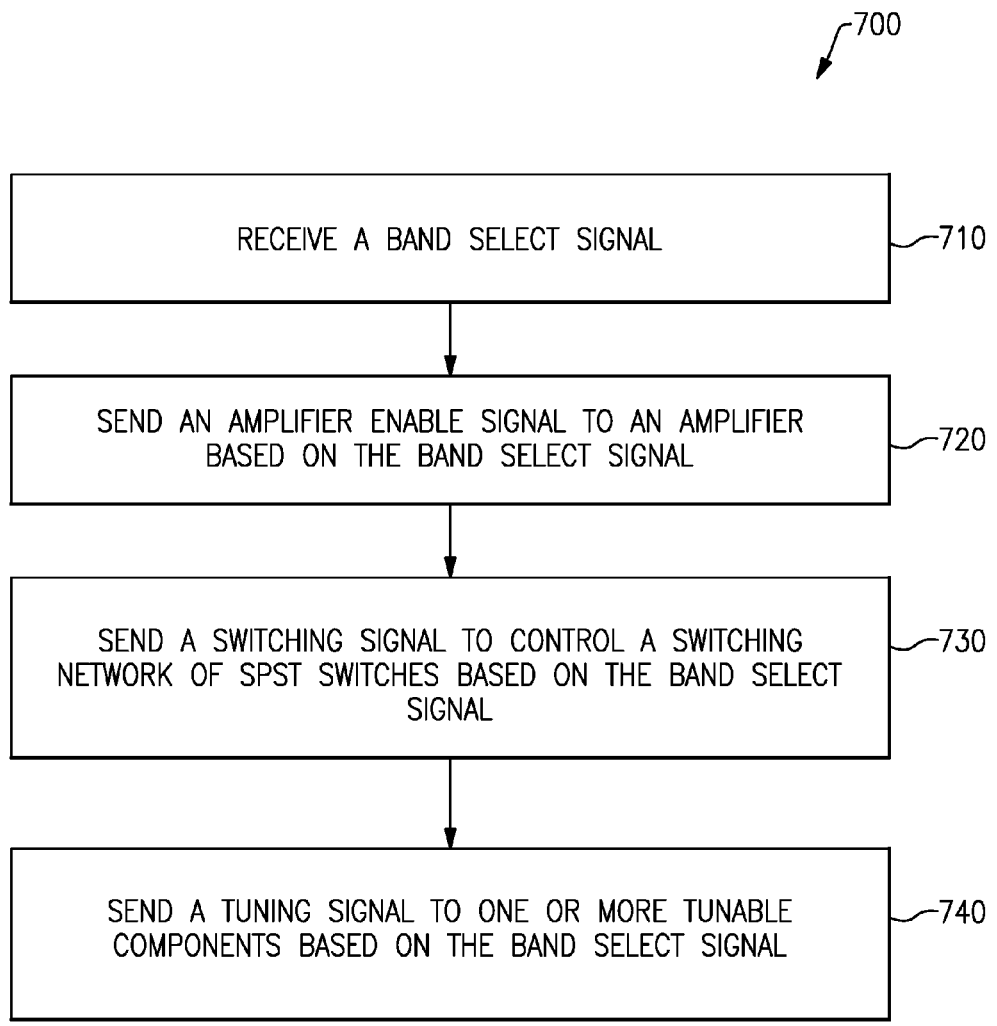
FIG. 7 shows an embodiment of a flowchart representation of a method of processing an RF signal.

FIG. 7 shows an embodiment of a flowchart representation of a method 700 of processing an RF signal. In some implementations (and as detailed below as an example), the method 700 is performed by a controller, such as the DRx controller 602 of FIG. 6. In some implementations, the method 700 is performed by processing logic, including hardware, firmware, software, or a combination thereof. In some implementations, the method 700 is performed by a processor executing code stored in a non-transitory computer-readable medium (e.g., a memory). Briefly, the method 700 includes receiving a band select signal and routing a received RF signal along one or more paths to process the received RF signal.

The method 700 begins, at block 710, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

At block 720, the controller sends an amplifier enable signal to an amplifier of a DRx module based on the band select signal. In some implementations, the band select signal indicates a single frequency band and the controller sends an amplifier enable signal to enable an amplifier disposed along a path corresponding to the single frequency band. The controller may send an amplifier enable signal to disable the other amplifiers disposed along other paths corresponding to other frequency bands. In some implementations, the band select signal indicates multiple frequency bands and the controller sends an amplifier enable signal to enable an amplifier disposed along one of the paths corresponding to one of the multiple frequency bands. The controller may send an amplifier enable signal to disable the other amplifiers. In some implementations, the controller enables the amplifier disposed along the path corresponding to the lowest frequency band.

At block 730, the controller sends a switching signal to control a switching network of single-pole/single-throw (SPST) switches based on the band select signal. The switching network includes a plurality of SPST switches coupling the plurality of paths corresponding to a plurality of frequency bands. In some implementations, the band select signal indicates a single frequency band and the controller sends a switching signal that opens all of the SPST switches. In some implementations, the band select signal indicates multiple frequency bands and the controller sends a switching signal to close one or more of the SPST switches so as to couple the paths corresponding to the multiple frequency bands.

At block 740, the controller sends a tuning signal to one or more tunable components based on the band select signal. The tunable components may include one or more of a plurality of tunable phase-shift components or a plurality of tunable impedance matching components. The controller may tune the tunable components based on a lookup table that associates frequency bands (or sets of frequency bands) indicated by the band select signal with tuning parameters. Accordingly, in response to a band select signal, the DRx controller may transmit a tuning signal to the tunable components (of active paths) to tune the tunable components (or the variable components thereof) according to the tuning parameters.

Figure 8:
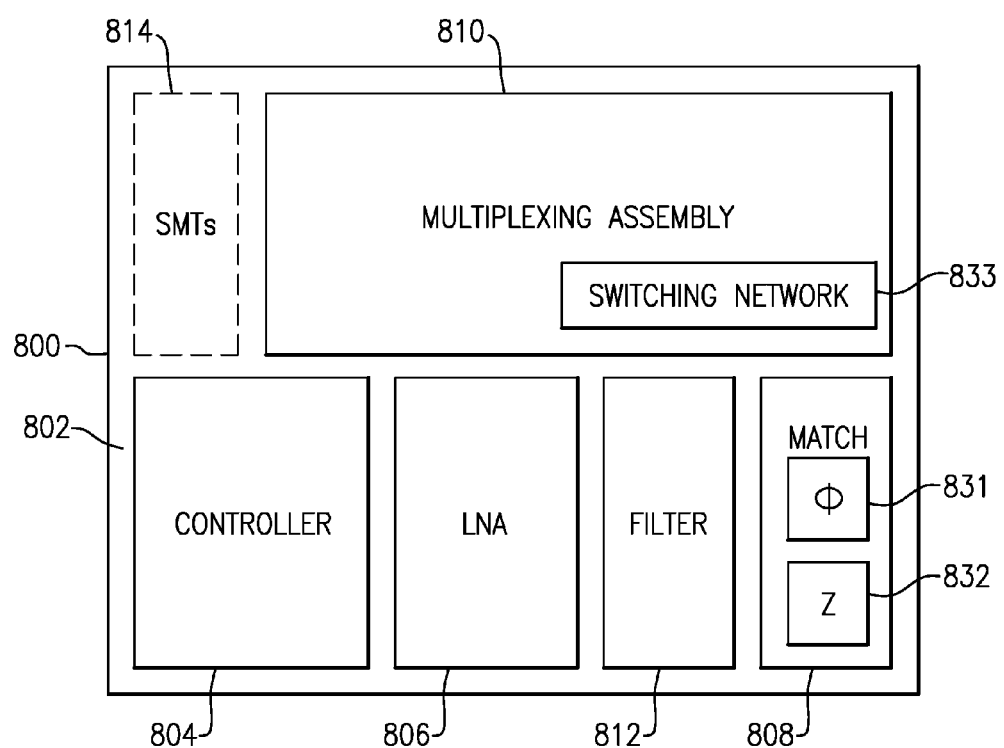
FIG. 8 depicts a module having one or more features as described herein.

FIG. 8 shows that in some embodiments, some or all of the diversity receiver configurations (e.g., those shown in FIGS. 3, 4, 5, and 6) can be implemented, wholly or partially, in a module. Such a module can be, for example, a front-end module (FEM). Such a module can be, for example, a diversity receiver (DRx) FEM. In the example of FIG. 8, a module 800 can include a packaging substrate 802, and a number of components can be mounted on such a packaging substrate 802. For example, a controller 804 (which may include a front-end power management integrated circuit [FE-PIMC]), a low-noise amplifier assembly 806 (which may include one or more variable-gain amplifiers), a match component 808 (which may include one or more fixed or tunable phase-shift components 831 and one or more fixed or tunable impedance matching components 832), a multiplexer assembly 810 (which may include a switching network 833 of SPST switches), and a filter bank 812 (which may include one or more bandpass filters) can be mounted and/or implemented on and/or within the packaging substrate 802. Other components, such as a number of SMT devices 814, can also be mounted on the packaging substrate 802. Although all of the various components are depicted as being laid out on the packaging substrate 802, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 9:
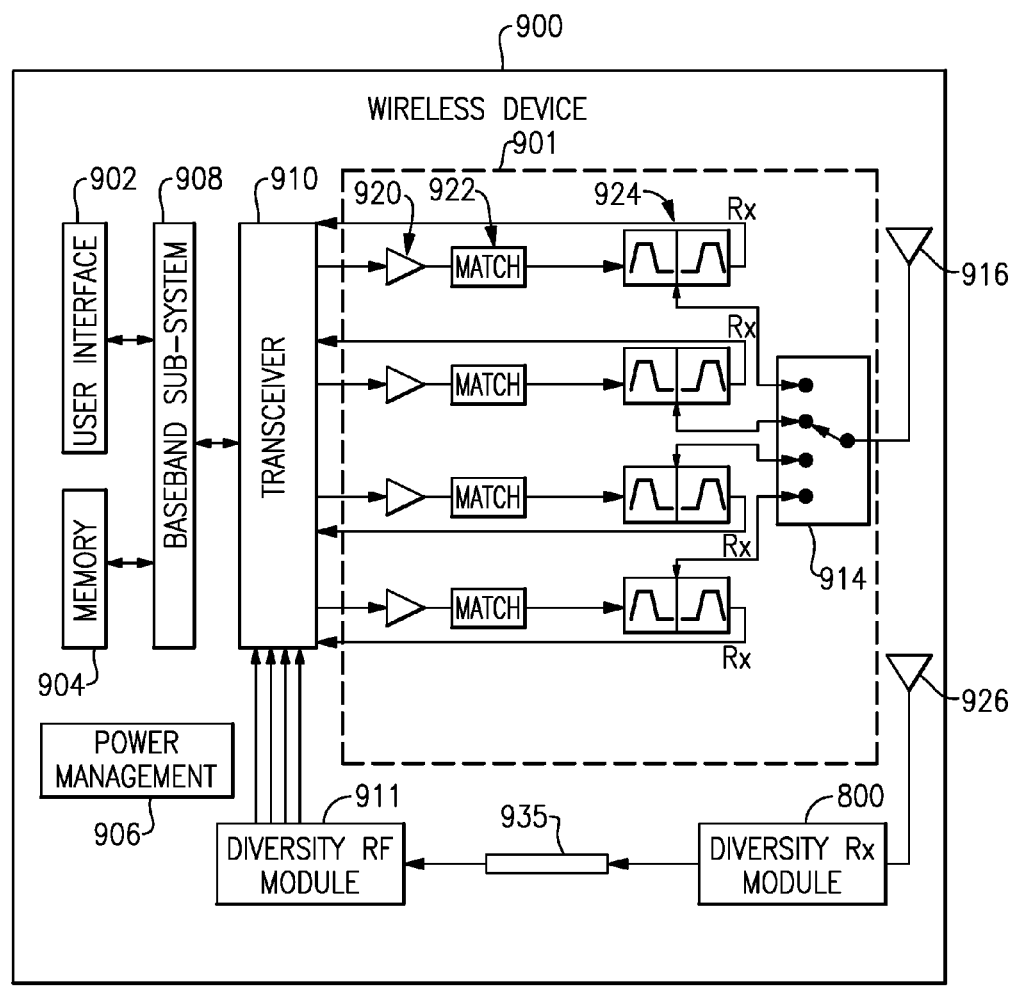
FIG. 9 depicts a wireless device having one or more features described herein.

FIG. 9 depicts an example wireless device 900 having one or more advantageous features described herein. In the context of one or more modules having one or more features as described herein, such modules can be generally depicted by a dashed box 901 (which can be implemented as, for example, a front-end module), a diversity RF module 911 (which can be implemented as, for example, a downstream module), and a diversity receiver (DRx) module 800 (which can be implemented as, for example, a front-end module).

Referring to FIG. 9, power amplifiers (PAs) 920 can receive their respective RF signals from a transceiver 910 that can be configured and operated in known manners to generate RF signals to be amplified and transmitted, and to process received signals. The transceiver 910 is shown to interact with a baseband sub-system 908 that is configured to provide conversion between data and/or voice signals suitable for a user and RF signals suitable for the transceiver 910. The transceiver 910 can also be in communication with a power management component 906 that is configured to manage power for the operation of the wireless device 900. Such power management can also control operations of the baseband sub-system 908 and the modules 901, 911, and 800.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In the example wireless device 900, outputs of the PAs 920 are shown to be matched (via respective match circuits 922) and routed to their respective duplexers 924. Such amplified and filtered signals can be routed to a primary antenna 916 through an antenna switch 914 for transmission. In some embodiments, the duplexers 924 can allow transmit and receive operations to be performed simultaneously using a common antenna (e.g., primary antenna 916). In FIG. 9, received signals are shown to be routed to "Rx" paths that can include, for example, a low-noise amplifier (LNA).

The wireless device also includes a diversity antenna 926 and a diversity receiver module 800 that receives signals from the diversity antenna 926. The diversity receiver module 800 processes the received signals and transmits the processed signals via a cable 935 to a diversity RF module 911 that further processes the signal before feeding the signal to the transceiver 910.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |

TABLE 1-continued

| Band | Mode | Tx Frequency Range (MHz) | Rx Frequency Range (MHz) |
|---|---|---|---|
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A receiver comprising:
   an input node and an output node;
   a first amplification path implemented between the input node and the output node, and including a first amplifier and a first bandpass filter;
   a second amplification path implemented between the input node and the output node, and including a second amplifier and a second bandpass filter; and
   a switch implemented to selectively couple the first amplification path and the second amplification path, the switch having a pole coupled to the first amplification path between the first amplifier and the first bandpass filter and a throw coupled to the second amplification path between the second amplifier and the second bandpass filter.

2. The receiver of claim 1 further comprising a controller configured to receive a band select signal and, based on the band select signal, enable a selected one of the first amplifier or the second amplifier and control the switch to thereby route a signal to the selected amplifier.

3. The receiver of claim 2 wherein the switch includes a single-pole-single-throw switch.

4. The receiver of claim 2 wherein the controller is configured to, in response to receiving a band select signal indicating a single frequency band, enable one of the first amplifier or the second amplifier corresponding the single frequency band and open the switch.

5. The receiver of claim 2 wherein the controller is configured to, in response to receiving a band select signal indicating multiple frequency bands, enable one of the first amplifier or the second amplifier corresponding to one of the multiple frequency bands and close the switch.

6. The receiver of claim 1 further comprising a first phase-shift component implemented along the first amplification path and configured to provide a phase shift for a signal to increase an impedance for a frequency band corresponding to the second amplification path.

7. The receiver of claim 6 wherein the first phase-shift component is implemented between the switch and the input node.

8. The receiver of claim 6 wherein the first phase-shift component is configured to provide a tunable phase shift by a desired amount.

9. The receiver of claim 1 further comprising a first impedance matching component implemented along the first amplification path and configured to decrease a noise figure associated with the first amplification path.

10. The receiver of claim 9 wherein the first impedance matching component is implemented between the switch and the first amplifier.

11. The receiver of claim 9 wherein the first impedance matching component is configured to provide a tunable impedance by a desired amount.

12. The receiver of claim 1 further comprising a multiplexer configured to split an input signal received at the input node into a first signal in a first frequency band routed along the first amplification path, and a second signal in a second frequency band routed along the second amplification path.

13. The receiver of claim 1 wherein each of the first and second amplifiers is a low-noise amplifier.

14. A receiver module comprising:
a packaging substrate configured to receive a plurality of components; and
a receive circuit implemented on the packaging substrate, the receiver circuit including an input node and an output node; a first amplification path implemented between the input node and the output node, and including a first amplifier and a first bandpass filter; a second amplification path implemented between the input node and the output node, and including a second amplifier and a second bandpass filter; and a switch implemented to selectively couple the first amplification path and the second amplification path, the switch having a pole coupled to the first amplification path between the first amplifier and the first bandpass filter and a throw coupled to the second amplification path between the second amplifier and the second bandpass filter.

15. The receiver module of claim 14 wherein the receiver module is a diversity receiver module.

16. The receiver module of claim 14 wherein the receive circuit further includes a first phase-shift component implemented along the first amplification path and configured to provide a phase shift for a signal to increase an impedance for a frequency band corresponding to the second amplification path.

17. The receiver module of claim 14 wherein the receive circuit further includes a first impedance matching component implemented along the first amplification path and configured to decrease a noise figure associated with the first amplification path.

18. A wireless device comprising:
an antenna configured to receive a signal;
a receiver module in communication with the antenna and configured to amplify the signal, the receiver module having a receive circuit that includes an input node and an output node; a first amplification path implemented between the input node and the output node, and including a first amplifier and a first bandpass filter; a second amplification path implemented between the input node and the output node, and including a second amplifier and a second bandpass filter; and a switch implemented to selectively couple the first amplification path and the second amplification path, the switch having a pole coupled to the first amplification path between the first amplifier and the first bandpass filter and a throw coupled to the second amplification path between the second amplifier and the second bandpass filter; and
a transceiver in communication with the receiver module and configured to further process the amplified signal from the receiver module.

19. The wireless device of claim 18 wherein the signal includes a cellular frequency signal, and the antenna is a diversity antenna.

20. The wireless device of claim 19 further comprising a transmission line implemented to route the amplified signal from the receiver module to the transceiver.

* * * * *